United States Patent
Lee et al.

(10) Patent No.: US 6,853,585 B2
(45) Date of Patent: Feb. 8, 2005

(54) FLASH MEMORY DEVICE HAVING UNIFORM THRESHOLD VOLTAGE DISTRIBUTION AND METHOD FOR VERIFYING SAME

(75) Inventors: Kyeong-Han Lee, Kyungki-do (KR); Sung-Soo Lee, Kyungki-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/694,920

(22) Filed: Oct. 27, 2003

(65) Prior Publication Data

US 2004/0109352 A1 Jun. 10, 2004

(30) Foreign Application Priority Data

Dec. 5, 2002 (KR) ................................. 10-2002-0076955

(51) Int. Cl.[7] .............................................. G11C 16/06
(52) U.S. Cl. ............................ 365/185.22; 365/185.18; 365/185.21

(58) Field of Search ....................... 365/185.22, 185.18, 365/185.21, 185.2

(56) References Cited

U.S. PATENT DOCUMENTS 5,877,985 A * 3/1999 Banba et al. ........... 365/185.18
6,462,988 B1 * 10/2002 Harari ..................... 365/185.2

* cited by examiner

*Primary Examiner*—Huan Hoang
(74) *Attorney, Agent, or Firm*—Marger Johnson & McCollom, P.C.

(57) ABSTRACT

A flash memory device including a memory cell array block including a plurality of flash memory cells. A program verify voltage generating unit variably generates a program verify voltage that verifies flash memory cells programming. A wordline level selecting unit transfers the program verify voltage to the flash memory cells. And a page buffer, including a latch, stores flash memory cell data and resets the latch whenever the program verify voltage is lowered.

9 Claims, 7 Drawing Sheets

FLASH MEMORY DEVICE HAVING UNIFORM THRESHOLD VOLTAGE DISTRIBUTION AND METHOD FOR VERIFYING SAME

CROSS REFERENCE TO RELATED APPLICATIONS

This application claims priority from Korean Patent Application No. 2002-76955, filed on Dec. 5, 2002, the contents of which are incorporated herein by reference in their entirety.

FIELD OF THE INVENTION

The present invention relates to a semiconductor memory device and, more particularly, to a flash memory device having a uniform threshold voltage distribution without misprogrammed cells.

BACKGROUND OF THE INVENTION

A flash memory device is a highly integrated information storage device in which write and erase operations are accomplished on board. A flash memory cell includes at least one field effect transistor (FET) having a selection gate, a floating gate, a source, and a drain. Threshold voltage variation results in charge fluctuation on the floating gate. The charge fluctuation is data that is stored in the flash memory cell.

Flash memory devices are classified into NAND and NOR devices. The NAND flash memory device is used as a mass data storage device, while the NOR flash memory device is an information storage device used in high speed data processing applications.

The NOR flash memory cell has two states, i.e., a programmed state and an erased state. When the NOR flash memory cell is programmed, residual electrons are trapped on a floating gate and a threshold voltage rises. Thus, drain-source current does not flow to a selected flash memory cell. The programmed state of the flash memory cell is typically a logic "0". When the flash memory cell is erased, there are a small number of residual electrons on the floating gate or lots of source-drain current flows to the flash memory cell. The erased state of the flash memory cell is typically a logic "1".

Figure 1:
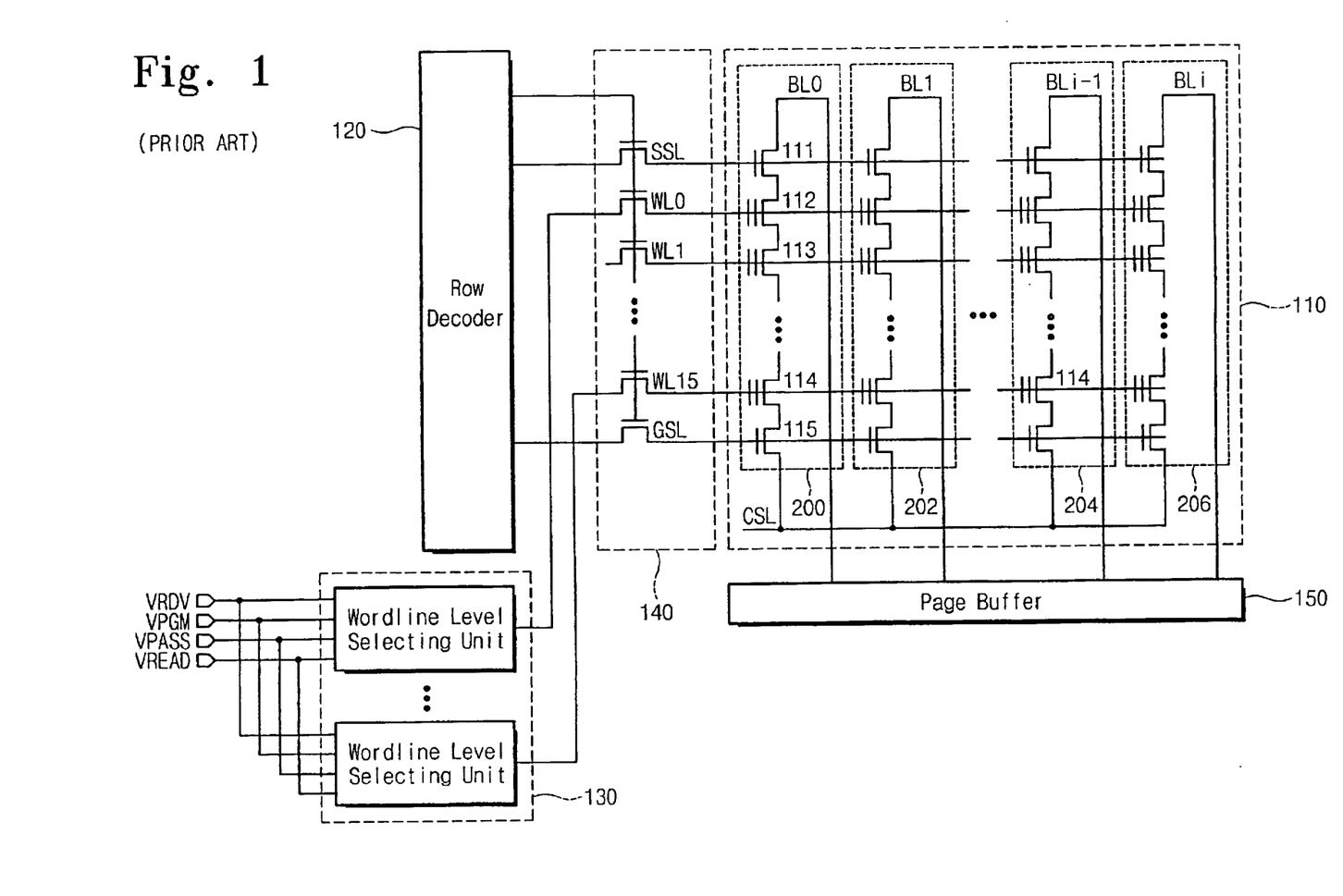
FIG. 1 is a block diagram of a conventional flash memory device.

A conventional flash memory device is partially illustrated in FIG. 1. Referring to FIG. 1, a flash memory device 100 includes a memory cell array block 110, a row decoder 120, wordline level selecting units 130, a driver unit 140, and a page buffer 150. The memory cell array block 110 has i strings 200, 202, 204, and 206. Flash memory cells are serially coupled to the strings 200, 202, 204, and 206. Specifically, flash memory cells, e.g., 112, 113, and 114, are serially coupled to first to sixteenth wordlines WLj (where j=1–15). A drain of the flash memory cell 112 coupled to the first wordline WL0 is coupled to a first selection transistor 111 whose gate is coupled to a string selection line SSL. A source of the flash memory cell 114 coupled to the sixteenth wordline WL15 is coupled to a second selection transistor 115 whose gate is coupled to a ground selection line GSL. A drain of the first selection transistor 112 is coupled to a first bitline BL0, and a source of the second selection transistor 115 is coupled to a common source line CSL.

The strings 200, 202, 204, and 206 are coupled to the string selection line SSL, the first to sixteenth wordlines WLj (j=0, 1, . . . , 15), and the ground selection line GSL.

Each of the strings 200, 202, 204, and 206 is connected to the page buffer 150 through bitlines BL0, BL1, . . . , BLi-1, and BLi to constitute a page unit. Although FIG. 1 shows only one page in the memory cell array block 110, the memory cell array block 110 might include a plurality of page units. The page units are addressed by the row decoder 120. Transistors in the driver unit 140 are turned on to select a page unit responsive to an addressing signal from the row decoder 120.

The wordline level selecting units 130 selects one of a program voltage VPGM, a read voltage VREAD, a program verify voltage VRDV, and a pass voltage VPASS in accordance with the corresponding mode. The program voltage VPGM is applied during a programming operation of selected flash memory cells. The read voltage VREAD is applied to during a reading operation of the selected flash memory cells. The program verify voltage VRDV is applied while verifying programming of the selected flash memory cells. The pass voltage VPASS is applied to unselected flash memory cells, so that cell current can flow or pass. The driver unit 140 applies a corresponding mode voltage to the wordlines WLj (j=0, 1, . . . , 15) in one selected page unit responsive to the addressing signal of the row decoder 120. The page buffer 150 senses the cell current flowing through the bitlines BL0, BL1, . . . , BLi-1, and BLi to verify data of selected flash memory cells.

The above-described flash memory device 100 iteratively repeats a program verify operation (i.e., "program unit loop") in which the flash memory device 100 programs the flash memory cells and then verifies whether cells were programmed. If a flash memory cell is normally programmed, a program operation stops. If not, the program operation is performed one more time and the program verify operation is iteratively repeated. For example, assuming that there are 4K flash memory cells coupled to a wordline WL, predetermined cycles are needed for programming the flash memory cells and verifying that the flash memory cells are programmed. If the cycles are iteratively repeated to verify that the flash memory cells coupled to the wordline WL are completely programmed, a program operation and a program verify operation of another wordline WL are repeated.

Figure 2:
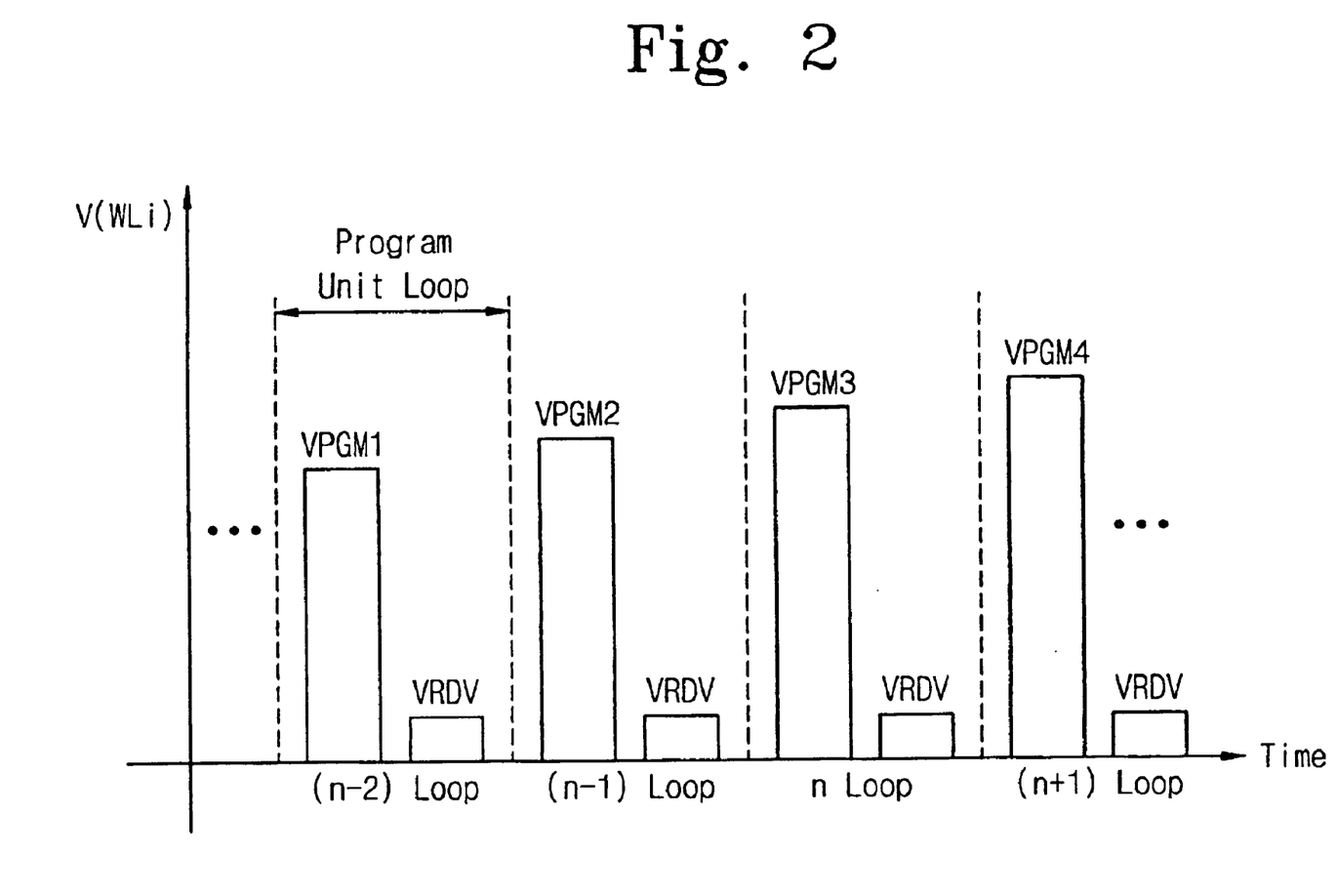
FIG. 2 is a program verify timing diagram of the flash memory device as shown in FIG. 1.

A program operation and a program verify operation of a selected wordline WL are iteratively repeated until no under-programmed flash memory cells exist. Once that occurs, the program operation ends. As shown in FIG. 2, the program voltage VPGM rises and the program verify read voltage VRDV is constantly maintained while one operation unit loop is iteratively conducted. During the program unit loop, cell current is intensifies by the under-programmed flash memory cells to raise the level of the common source line CSL. If a constant program verify voltage VRDV is applied during a subsequent program unit loop, the level of the common source line CSL is raised to weaken the cell current. The result is that cells might be determined programmed when they are not.

The threshold voltage Vt of a flash memory cell has distribution based on the program verify method of FIG. 2, which will be described with reference to FIG. 3.

Figure 3:
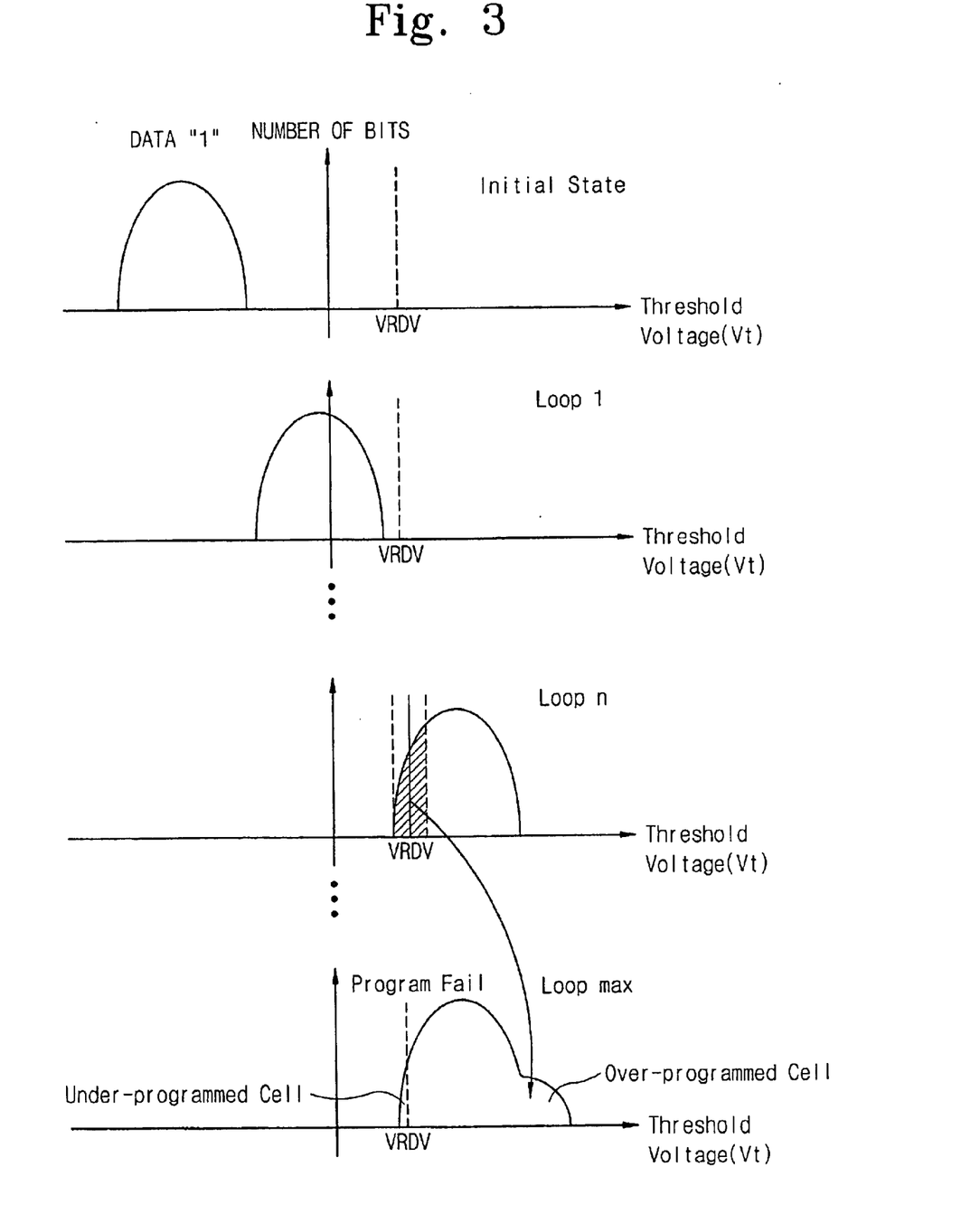
FIG. 3 is a timing diagram of a threshold voltage distribution.

Referring to FIG. 3, in an initial state where an erase operation for all flash memory cells is conducted, the threshold voltage Vt of the flash memory cells has a negative voltage level. The program unit loops are sequentially conducted. In the last program unit loop, flash memory cells are programmed by a high program voltage VPGM, so that the threshold voltage has a high and non-uniform distribution. The non-uniform distribution of the flash memory cells having the high threshold voltage Vt causes flash memory cells of a page unit to be incompletely erased in an erase operation (over-program). Since it is unclear whether the flash memory cells having a low threshold voltage that is close to the program verify voltage VRDV are programmed, they remain under-programmed.

SUMMARY OF THE INVENTION

It is an object of the present invention to address disadvantages associated with prior semiconductor memory devices. The present invention provides a flash memory device having a uniform threshold voltage distribution without misprogrammed cells. The present invention also provides a program verify method that seeks a similar goal.

An embodiment of the invention provides a flash memory device that includes a memory cell array block including a plurality of flash memory cells. A program verify voltage generating unit variably generates a program verify voltage that verifies flash memory cells programming. A wordline level selecting unit transfers the program verify voltage to the flash memory cells. And a page buffer, including a latch, stores flash memory cell data and resets the latch whenever the program verify voltage is lowered.

The program verify voltage generating unit includes a PMOS transistor coupled at a first end to a power supply voltage. First to third resistors are serially coupled between a second end of the PMOS transistor and a ground voltage. A first NMOS transistor is coupled across the first resistor and responsive to a first program verify control signal, the first NMOS transistor generating a program verify voltage. A second NMOS transistor is coupled across the second resistor responsive to a second program verify control signal. And a comparator is capable of comparing a voltage at a node between the first and second resistors with a reference voltage, the comparator having an output connected a gate of the PMOS transistor.

The first and second program verify control signals are selectively activated to thereby fluctuate the program verify voltage.

The wordline level selecting unit applies a program voltage, a read voltage, and a pass voltage or an erase voltage to a wordline.

The page buffer includes a first NMOS transistor coupled to the flash memory cells and responsive to a first bitline control signal. A first PMOS transistor is coupled to the first NMOS transistor and capable of precharging a sensing node to a predetermined voltage level responsive to a precharge signal. A second NMOS transistor is coupled to the sensing node and gates to a second bitline control signal. A latch is coupled to the second NMOS transistor and capable of latching the voltage at the sensing node. A third NMOS transistor is coupled to the latch and responsive to the voltage at the sensing node. A fourth NMOS transistor is coupled between the third NMOS transistor and a ground voltage and capable of storing the flash memory cell data in the latch responsive to a first latch control signal. And a fifth NMOS transistor is coupled between the sensing node and a ground voltage and capable of resetting the sensing node responsive to a bitline reset signal.

The page buffer includes a sixth NMOS transistor capable of transferring data inputted in a program operation of the flash memory device responsive to a data loading enable signal. A second latch stores the inputted data. A seventh NMOS transistor is coupled to the second latch and operates responsive to the voltage level at the sensing node. An eighth NMOS transistor is coupled between the seventh NMOS transistor and a ground voltage and is capable of latching the inputted data to the second latch responsive to a second latch control signal. And a ninth NMOS transistor is coupled between the first latch and the fourth NMOS transistor and operates responsive to the inputted data.

Another embodiment of the present invention includes a method of verifying flash memory cell programming. The method includes applying a predetermined program voltage to a plurality of flash memory cells. The method further includes generating a program verify voltage in selective response to program verify control signals. The method further includes verifying flash memory cell programming responsive to the program verify voltage. The method further includes repeating, applying, generating, and verifying when the flash memory cells are programmed. The method further includes maintaining the program verify voltage uniform during predetermined program unit loop cycles. And the method includes storing the flash memory cell data in a latch at each program unit loop cycle where the program verify voltage level is lowered.

DESCRIPTION OF THE PREFERRED EMBODIMENT

Figure 4:
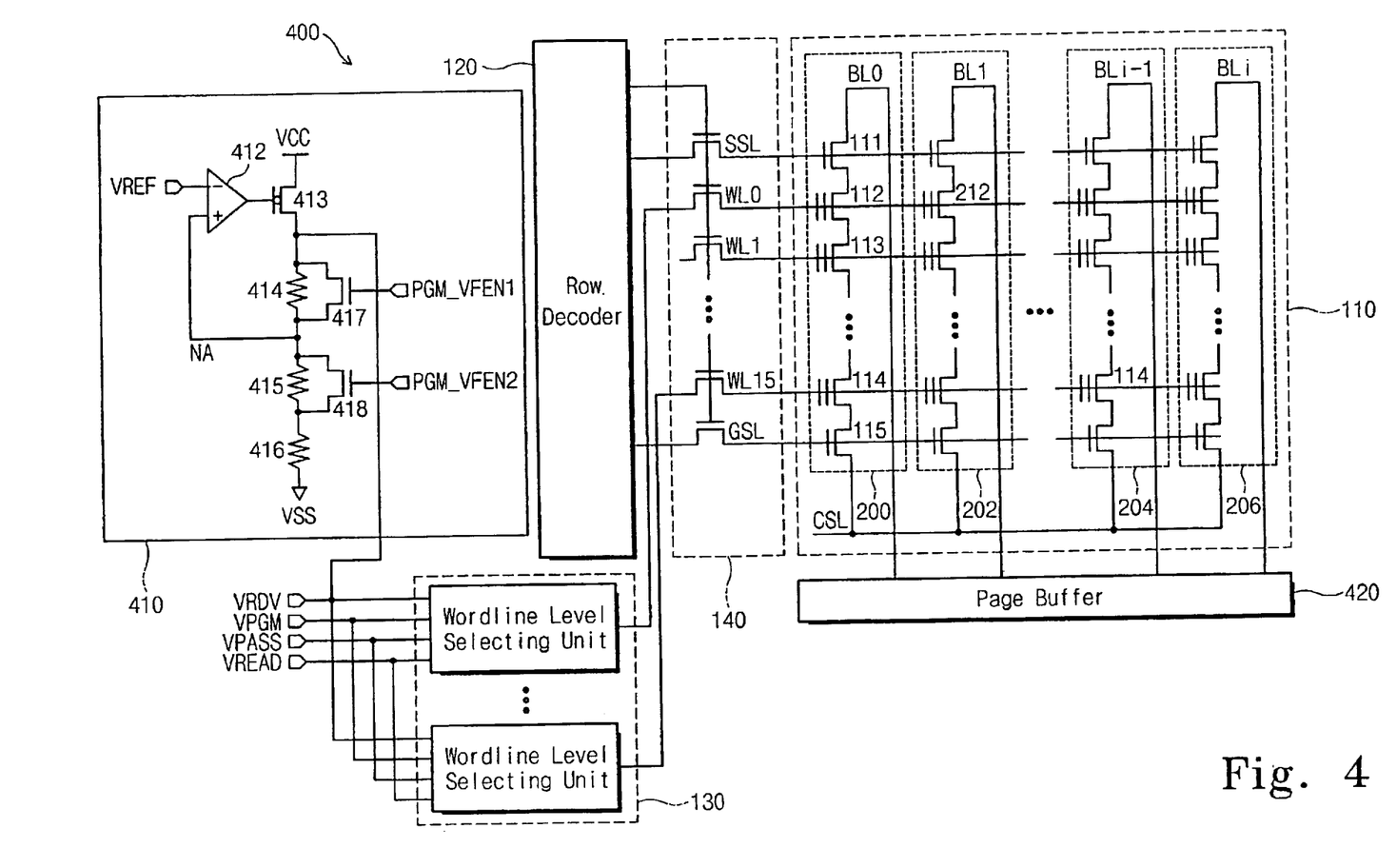
FIG. 4 is a block diagram of a flash memory device according to an embodiment of the present invention.

A flash memory device according to the present invention is now described below with reference to FIG. 4. Referring to FIG. 4, a flash memory device 400 includes a memory cell array block 110, a row decoder 120, a wordline level selecting unit 130, a program verify voltage generating unit 410, and a page buffer 420. The memory cell array block 110, the row decoder 120, and the wordline level selecting unit 130 are similar with those described earlier with reference to FIG. 1.

The program verify voltage generating unit 410 has a PMOS transistor 413 and first to third resistors 414, 415, and 416 that are serially coupled between a power supply voltage VCC and a ground voltage VSS. Further, the program verify voltage generating unit 410 has a first NMOS transistor 417 coupled to both ends of the first resistor 414 and a second NMOS transistor 418 coupled to both ends of the second resistor 415. The PMOS transistor 412 gates to an output of a comparator 412 for comparing a reference voltage VREF with an NA node voltage. The first NMOS transistor 417 gates to a first program verify control signal PGM_VFEN1 to short the first resistor 414. The second NMOS transistor 418 gates to a second program verify control signal PGM_VFEN2 to short the second resistor 415.

The program verify voltage generating unit 410 is selectively shorted depending on whether the first program verify control signal PGM_VFEN1 or the second program verify control signal PGM_VFEN2 is activated. Thus, the level of a program verify voltage VRDV is high or low responsive to the control signals PGM_VFEN1 and PGM_VFEN2.

Figure 5:
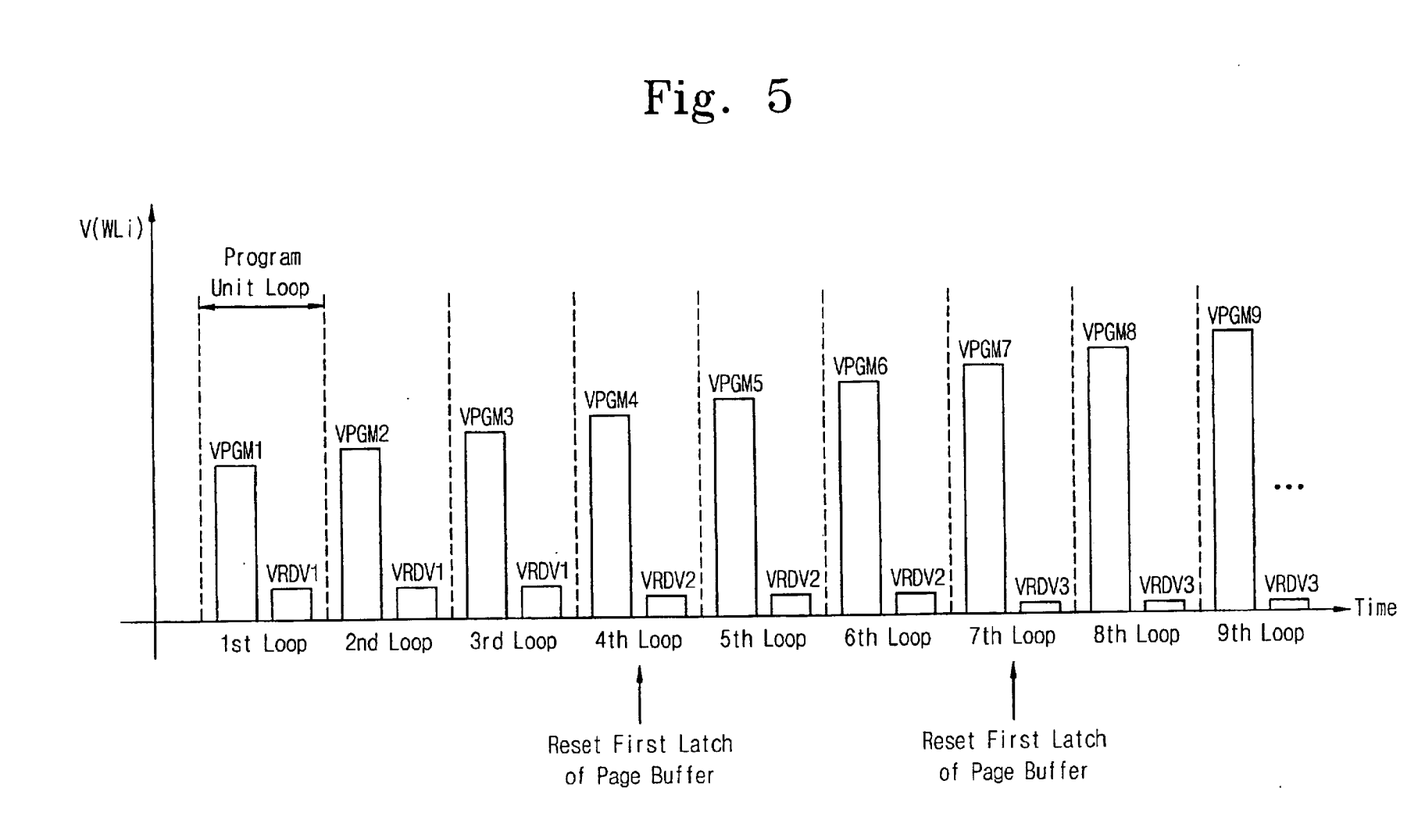
FIG. 5 is a program verify timing diagram of an example employing a program verify voltage.

FIG. 5 shows an example of a program verify method employing the program verify voltage VRDV generated by the program verify voltage generating unit 410. At a first program unit loop a program verify operation is conducted by the first program verify voltage VRDV1 after a program operation is performed by a first program voltage VPGM1. The first program verify voltage VRDV1 has a higher voltage level than the threshold voltage of flash memory cells. At a second program unit loop a program verify operation is conducted by a same voltage level as the first program verify voltage VRDV1 after a program operation is performed by a second program voltage VPGM2. At a third program unit loop a program verify operation is conducted by the same voltage level as the first program verify voltage VRDV1 after a program operation is performed by a third program voltage VPGM3. At a fourth program unit loop a program verify operation is conducted by a second verify voltage VRDV2 having lower voltage level than the first program verify voltage VRDV1 after a program operation is performed by a fourth program voltage VPGM4. At a fifth program unit loop a program verify operation is conducted by the same level as the second program verify voltage VRDV2 after a program operation is performed by a fifth program voltage VPGM5. At a sixth program unit loop a program verify operation is conducted by the same level as the second program verify voltage VRDV2 after a program operation is performed by a sixth program voltage VPGM6. Likewise, a program operation is conducted with rise in a program voltage at each program unit loop while a program verify voltage is lowered at each cycle of three program unit loops. In this case, a first latch of a page buffer is reset at each of third and fourth program unit loop cycles where the program verify voltage is lowered.

Figure 6:
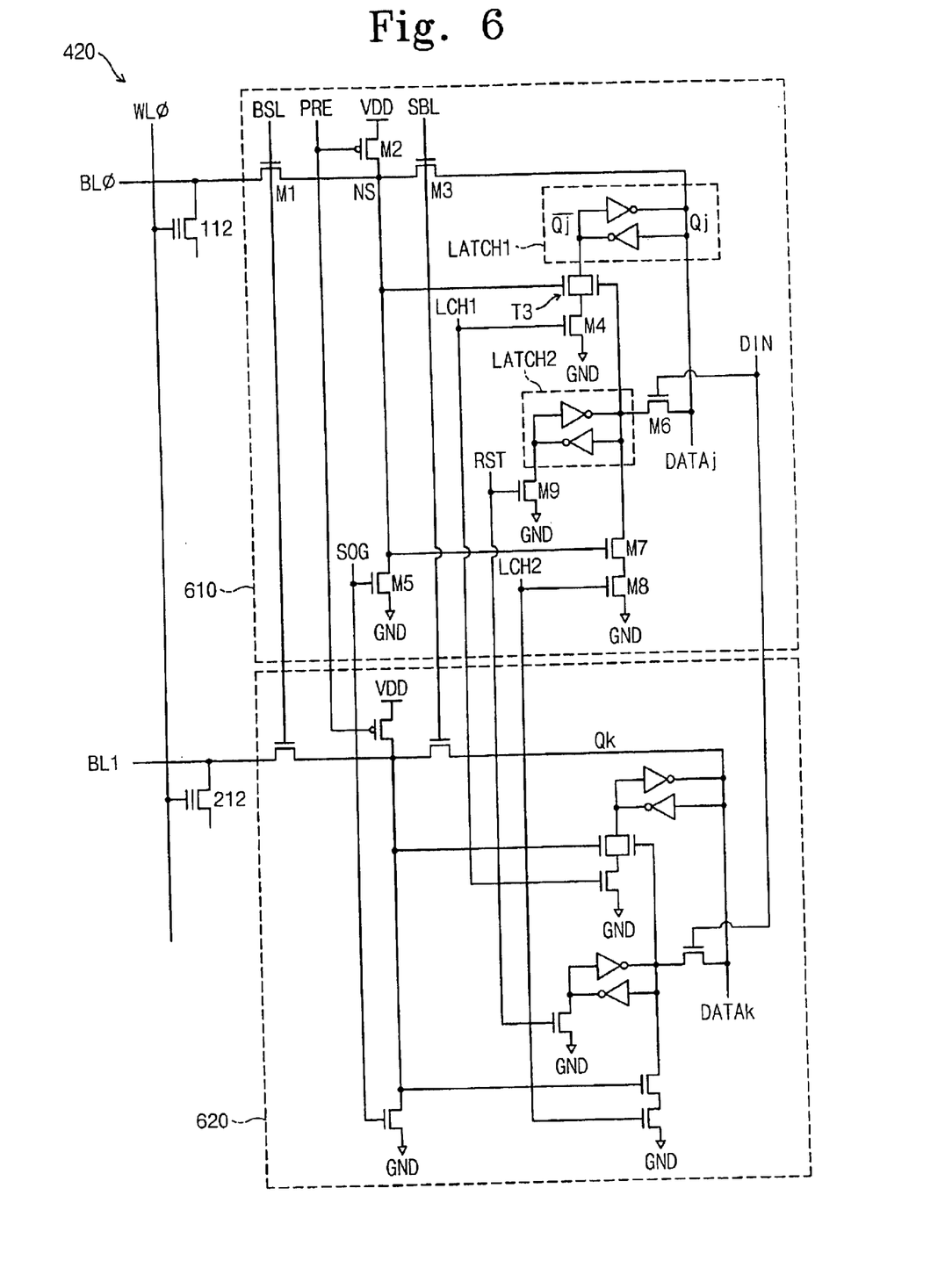
FIG. 6 is a page buffer as shown in FIG. 4.

The page buffer 420 is now described below with reference to FIG. 6. Referring to FIG. 6, the page buffer 420 is coupled flash memory cells 112 and 212 which are coupled to a first wordline WL0 and first and second bitlines BL0 and BL1, respectively. For the convenience of description, a first page buffer 610 coupled to the first flash memory cell 112 is described. The first page buffer 610 has first to eight NMOS transistors M1, M3, M4, M5, M6, M7, M8, and M9, a first PMOS transistors M2, first and second latches LATCH1 and LATCH2, and a transfer gate T3. The first NMOS transistor M1 is coupled between a bitline BL0 and a sensing node NS and gates to a first bitline selection signal BSL. The first PMOS transistor M2 precharges the bitline BL0 to the level of a power supply voltage VDD. The second NMOS transistor M3 is coupled to the sensing node NS and gates to a second bitline selection signal SBL. The transfer gate T3 is coupled to the first latch LATCH1 and gates to a voltage of the sensing node NS and input data DATAj. The third NMOS transistor M4 is coupled between the transfer gate T3 and a ground voltage GND. The fourth NMOS transistor M5 is coupled between the sensing node NS and a ground voltage GND and gates to a bitline reset signal SOG. The fifth NMOS transistor M6 is coupled to the second latch LATCH2 and gates to a data loading enable signal DIN. The sixth NMOS transistor M7 is coupled to the second latch LATCH2 and gates to the voltage level of the sensing node NS. The seventh NMOS transistor M8 is coupled between the NMOS transistor M7 and a ground voltage GND and gates to a second latch control signal LCH2. The eighth NMOS transistor M9 is coupled between the second latch LATCH2 and a ground voltage GND and gates to a reset signal RST.

The operation of the first page buffer 610 is explained in detail. The first latch LATCH1 performs a program operation and a program verify operation to the first flash memory cell 112. To program to the first flash memory cell 112, a precharge signal PRE is applied at a logic high level to turn off the first PMOS transistor M2. A voltage of 0V is applied to a node Qj and first and second bitline control signals BSL and SBL goes to a logic high level, so that the first and second NMOS transistors M1 and M3 are turned on to transfer a voltage level of the node Qj to a bitline BL0. The second latch LATCH2 latches external data DATAj in response to a data loading enable signal DIN, holding the external data DATAj until a program operation is completed onto the first flash memory cell 112. In this case, the level of the power supply voltage VDD is applied to a node Qk in order to inhibit the second flash memory cell 212 from being programmed.

In the event that the program verify operation is conducted, when the second bitline control signal SBL is in a high level, the nodes Qj and Qk are reset to 0V in response to the high level of the sensing reset signal SOG. Afterwards, the bitlines BL0 and BL1 are precharged to the level of the power supply voltage VDD in response to the low level of a precharge signal PRE. When a first latch control signal LCH1 becomes high, data of the first flash memory cell 112 is stored in the node Qj. When it is verified that the first flash memory cell 112 is completely programmed, the voltage level of the node Qj is maintained at the power supply voltage level to inhibit a program operation at a subsequent programming cycle. The power supply voltage VDD, which is applied to the node Qk in order to inhibit the second flash memory cell 212 from being programmed, is stored the second latch LATCH2. For this reason, although the first latch control signal LCH1 becomes high, the node Qk is maintained at the level of the power supply voltage VDD to inhibit the program operation at the next programming cycle.

When the voltage level of the nodes Qj and Qk of the first latch LATCH1 becomes the power supply voltage level by iteratively repeating the program and program verify operations, programming is complete.

Now, a program voltage and a program verify voltage at each program unit loop of FIG. 5 are described with the operation of the page buffer 420 of FIG. 6. At each program unit loop where the program verify voltage is lowered, the bitline reset signal SOG in the page buffer 420 is activate high. This is to remove over-programmed cells that are present at the threshold voltage distribution of flash memory cells. The program verify operation is conducted by applying a program verify voltage higher than the threshold voltage of flash memory cells that makes it possible to eliminate under-programmed cells.

The distribution of the flash memory cells according to the program verify method of the present invention is now described below with reference to FIG. 7.

Figure 7:
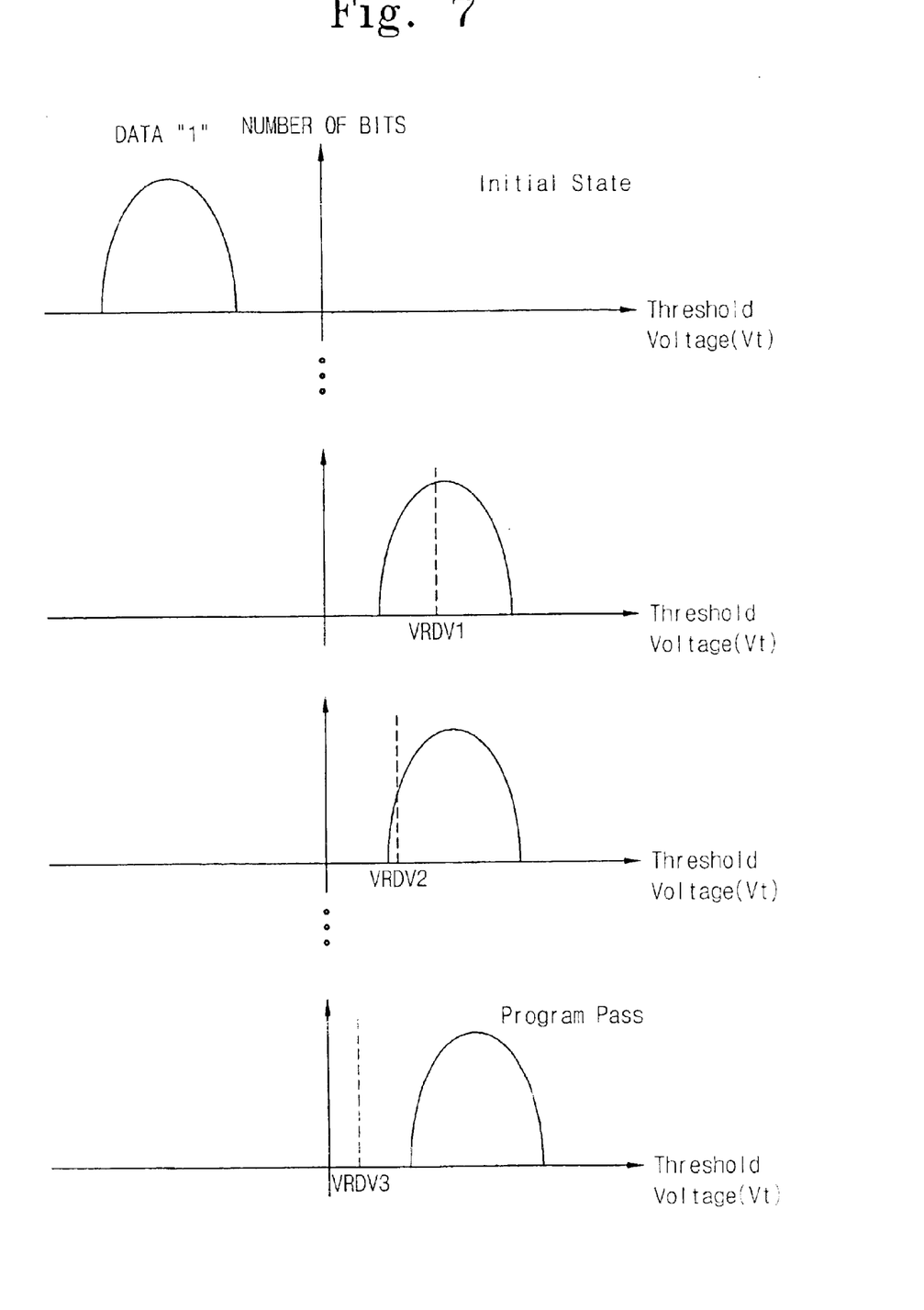
FIG. 7 is a timing diagram of a threshold voltage distribution according to an embodiment of the present invention.

Referring to FIG. 7, in an initial state, the threshold voltages Vt of flash memory cells has a negative voltage level. When program unit loops are repeated with variation of a program verify voltage VRDV, it is uncertain whether flash memory cells having a threshold voltage that is close to a second program verify voltage VRDV2 at an (N−1)th program unit loop are programmed. At an Nth program unit loop, it is verified that they are under-programmed and thus the program operation is re-conducted. At the last program unit loop, the threshold voltages Vt of the flash memory cells are uniformly distributed to eliminate under-programmed flash memory cells and over-programmed flash memory cells.

As a result, the program verify method according to the present invention makes it possible to prevent generation of under-programmed cells and over-programmed cells. As explained so far, a program verification is conducted while a program verify voltage is maintained during predetermined program cycles, and a first latch of a page buffer is reset at a program unit loop where the program verify voltage is lowered. Thus, the threshold voltage distribution of the flash memory cells becomes uniform without under or over-programmed cells.

While the present invention has been described with reference to the specific embodiment, it is to be clearly understood that many modifications and variations may be made by a person skilled in the art within the scope and spirit of the present invention.

We claim:

1. A flash memory device, comprising:
    a memory cell array block including a plurality of flash memory cells;
    a program verify voltage generating unit capable of variably generating a program verify voltage that verifies flash memory cells programming;
    a wordline level selecting unit capable of transferring the program verify voltage to the flash memory cells; and
    a page buffer including a latch capable of storing data of the flash memory cells and resetting the latch whenever the program verify voltage is lowered.

2. The flash memory device of claim 1 where the program verify voltage generating unit includes:
    a PMOS transistor coupled at a first end to a power supply voltage;
    first to third resistors serially coupled between a second end of the PMOS transistor and a ground voltage;
    a first NMOS transistor coupled across the first resistor and responsive to a first program verify control signal, the first NMOS transistor generating a program verify voltage;
    a second NMOS transistor coupled across the second resistor responsive to a second program verify control signal; and
    a comparator capable of comparing a voltage at a node between the first and second resistors with a reference voltage, the comparator having an output connected a gate of the PMOS transistor.

3. The flash memory device of claim 2 where the first and second program verify control signals are selectively activated to thereby fluctuate the program verify voltage.

4. The flash memory device of claim 1 where the wordline level selecting unit applies a program voltage, a read voltage, and a pass voltage or an erase voltage to a wordline.

5. The flash memory device of claim 1 where the page buffer includes:
    a first NMOS transistor coupled to the flash memory cells and responsive to a first bitline control signal;
    a first PMOS transistor coupled to the first NMOS transistor and capable of precharging a sensing node to a predetermined voltage level responsive to a precharge signal;
    a second NMOS transistor coupled to the sensing node and gates to a second bitline control signal;
    a latch coupled to the second NMOS transistor and capable of latching the voltage at the sensing node;
    a third NMOS transistor coupled to the latch and responsive to the voltage at the sensing node;
    a fourth NMOS transistor coupled between the third NMOS transistor and a ground voltage and capable of storing the flash memory cell data in the latch responsive to a first latch control signal; and
    a fifth NMOS transistor coupled between the sensing node and a ground voltage and capable of resetting the sensing node responsive to a bitline reset signal.

6. The flash memory device of claim 5 where the page buffer includes:
    a sixth NMOS transistor capable of transferring data inputted in a program operation of the flash memory device responsive to a data loading enable signal;
    a second latch capable of storing the inputted data;
    a seventh NMOS transistor coupled to the second latch and responsive to the voltage level at the sensing node;
    an eighth NMOS transistor coupled between the seventh NMOS transistor and a ground voltage and capable of latching the inputted data to the second latch responsive to a second latch control signal; and
    a ninth NMOS transistor coupled between the first latch and the fourth NMOS transistor and responsive to the inputted data.

7. A method of verifying flash memory cell programming, comprising:
    applying a predetermined program voltage to a plurality of flash memory cells;
    generating a program verify voltage in selective response to program verify control signals;
    verifying flash memory cell programming responsive to the program verify voltage;
    repeating, applying, generating, and verifying when the flash memory cells are programmed;
    maintaining the program verify voltage uniform during predetermined program unit loop cycles; and
    storing the flash memory cell data in a latch at each program unit loop cycle where the program verify voltage level is lowered.

8. The method of claim 7 comprising initially applying a voltage higher than the threshold voltage of the flash memory cells as the program verify voltage.

9. The method of claim 7 comprising increasing the program voltage at each program unit loop.

* * * * *